United States Patent [19]
Koike

[11] Patent Number: 5,851,865
[45] Date of Patent: Dec. 22, 1998

[54] METHOD OF MANUFACTURING SEMICONDUCTOR DEVICE HAVING MASK LAYER FORMING STEP FOR ION IMPLANTATION

[75] Inventor: Hidetoshi Koike, Kawasaki, Japan

[73] Assignee: Kabushiki Kaisha Toshiba, Tokyo, Japan

[21] Appl. No.: 707,659

[22] Filed: Sep. 4, 1996

[30] Foreign Application Priority Data

Sep. 5, 1995 [JP] Japan ..................................... 7-227757

[51] Int. Cl.⁶ ................................................. H01L 21/8238
[52] U.S. Cl. .......................... 438/217; 438/232; 438/289; 438/290; 438/291
[58] Field of Search ..................................... 438/199, 223, 438/224, 227, 228, 231, 232, 289, 290, 291, 168, 205, 217, 218

[56] References Cited

PUBLICATIONS

H. Koike, et al., "Process Simplification in Deep Submicron CMOS Fabrication", fourth IEEE/UCS/SEMI 1995 Int'l Symposium on Semiconductor Manufacturing.

Tadahiko Horiuchi, et al., "A 7–Mask CMOS Process with Selective Oxide Deposition", IEE Transactions on electronic devices, vol. 40, No. 8, Aug. 1993.

K. Kasai, et al., "W/WNx/Poly–Si Gate Technology for Future High Speed Deep Submicron CMOS LSIs", IEEE International Electron Devices Meeting 1994, Technical Digest pp. 497–500.

*Primary Examiner*—John Niebling
*Assistant Examiner*—Long Pham
*Attorney, Agent, or Firm*—Loeb & Loeb LLP

[57] ABSTRACT

A gate oxide layer and a polysilicon layer are formed in sequence over the major surface of a semiconductor substrate. A photoresist layer is formed on the polysilicon layer and an opening is formed in the photoresist layer. Using the photoresist layer as a mask, boron is ion implanted through the polysilicon layer and the gate oxide layer into the semiconductor substrate. Phosphorus is next ion implanted into the polysilicon layer by using the photoresist layer as a mask. Different ion species are ion implanted into the semiconductor substrate and the polysilicon layer, respectively, by using the same photoresist layer, thus decreasing the number of photoetching steps in manufacture of semiconductor devices.

35 Claims, 9 Drawing Sheets

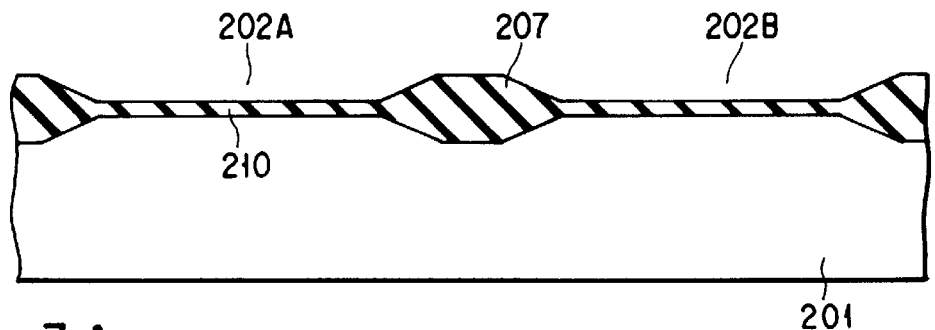
F I G. 3A
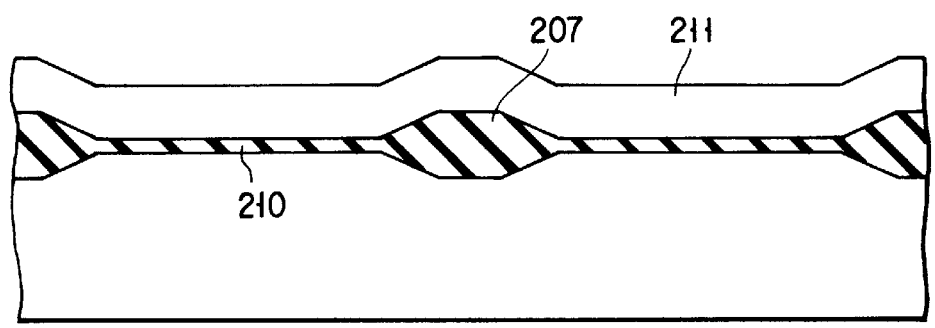
F I G. 3B
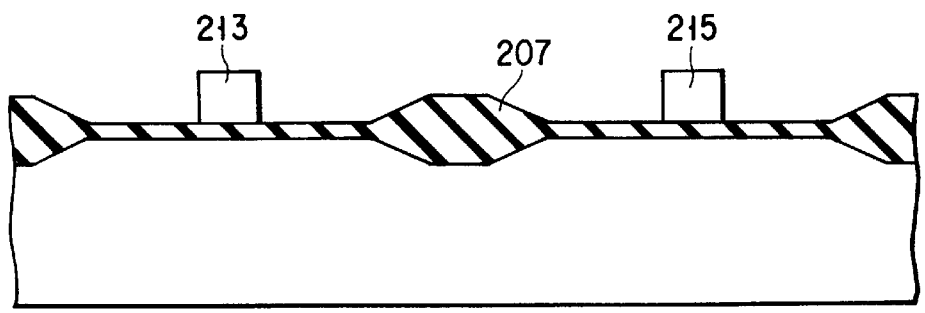
F I G. 3C
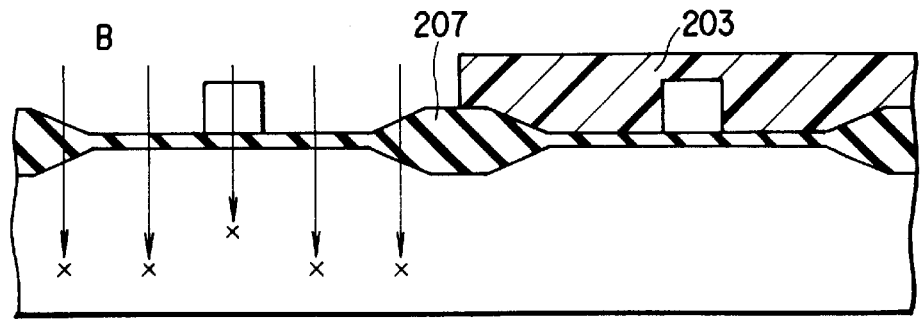
F I G. 3D

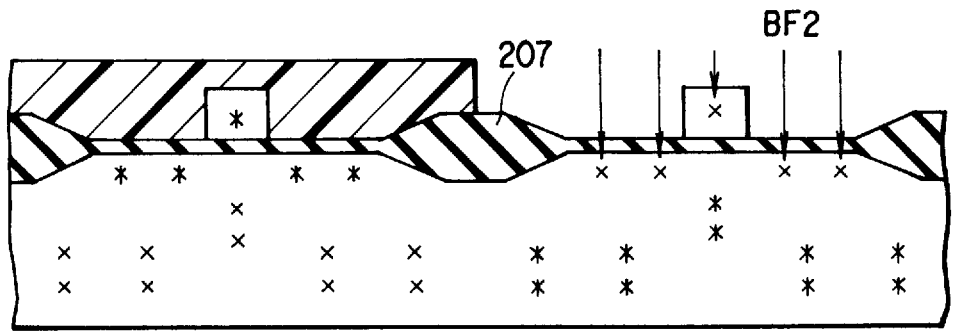
F I G. 3 I
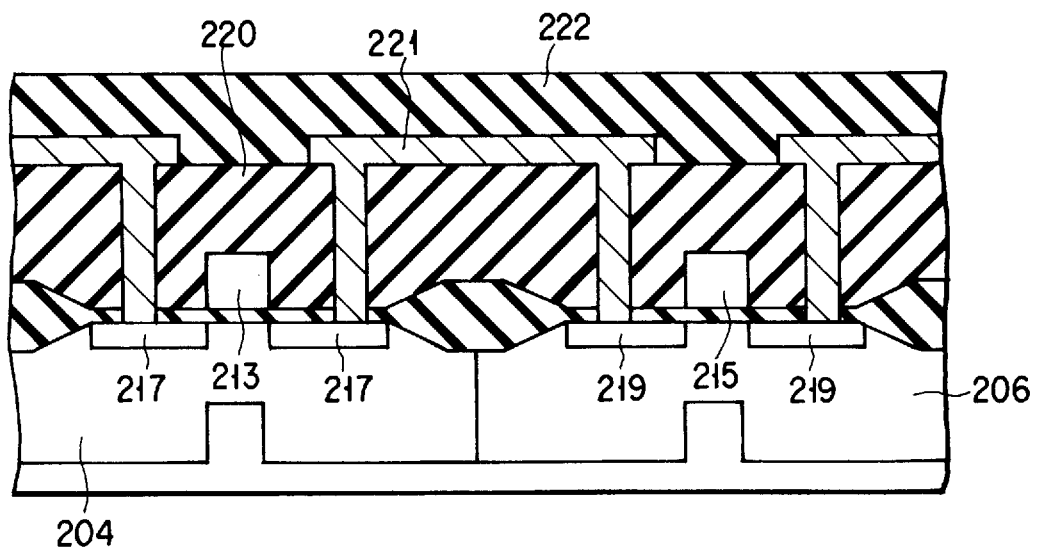
F I G. 3 J

METHOD OF MANUFACTURING SEMICONDUCTOR DEVICE HAVING MASK LAYER FORMING STEP FOR ION IMPLANTATION

BACKGROUND OF THE INVENTION

1. Field of the Invention

The invention relates to a method of manufacturing a MOS semiconductor device and more particularly to a manufacturing method which is adapted to decrease the number of photoetching steps.

2. Description of the Related Art

FIGS. 1A through 1G illustrate a conventional method of manufacturing a semiconductor device, for example, a CMOS semiconductor device, in the order of steps of manufacture.

First, an oxide layer 302 is formed over the major surface of a semiconductor substrate 301 by means of thermal oxidation. Next, a photoresist layer 303 is formed and then subjected to the first photoetching process to form an opening over a region where a P-well diffusion layer is to be formed. Using the photoresist layer 303 as a mask, boron is ion implanted into that region of the semiconductor substrate 301 to form the P-well diffusion layer. This state is shown in FIG. 1A.

Next, after the photoresist layer 303 is removed, a photoresist layer 305 is formed and then subjected to the second photoetching process to form an opening over a region where an N-well diffusion layer is to be formed. Using the photoresist layer 305 as a mask, phosphorus is ion implanted into that region of the semiconductor substrate 301 to form the N-well diffusion layer. This state is shown in FIG. 1B.

Next, the photoresist layer 305 is removed. The semiconductor substrate 301 is then subjected to heat treatment for well diffusion, so that the P-well diffusion layer 304 and the N-well diffusion layer 306 are formed. Next, a field oxide layer 307 adapted for device isolation is formed by means of selective oxidation techniques. This state is shown in FIG. 1C.

Next, a photoresist layer 308 is formed and then the third photoetching process is carried out to form an opening over the P-well diffusion layer 304. Using the field oxide layer 307 and the photoresist layer 308 as a mask, boron is ion implanted into the P-well diffusion layer 304 to thereby adjust the threshold voltage of the N-channel device. This state is shown in FIG. 1D.

Next, after the photoresist layer 308 is removed, the fourth photoetching process is carried out to form a photoresist mask layer 309 which has an opening over the N-well diffusion layer 306. Using the field oxide layer 307 and the photoresist layer 309 as a mask, phosphorous is ion implanted into the N-well diffusion layer 306 to thereby adjust the threshold voltage of the P-channel device. This state is shown in FIG. 1E.

Next, the photoresist layer 309 and the oxide layer 302 which are contaminated by the steps so far are removed. A gate oxide layer 310 is formed over the exposed diffusion layers 304 and 306 by means of thermal oxidation. A polysilicon layer 311 is formed over the field oxide layer 307 and the gate oxide layer 310 by means of chemical vapor deposition. The fifth photoetching process is next carried out to form a photoresist mask layer 312 which has an opening over the P-well diffusion layer 304. Using the photoresist layer 312 as a mask, phosphorous is ion implanted into the polysilicon layer 311 located over the P-well diffusion layer 304 so that the polysilicon layer will have N-type conductivity. This state is illustrated in FIG. 1F.

Next, after the photoresist layer 312 is removed, the sixth photoetching is carried out to form a photoresist mask layer 314 which has an opening over the N-well diffusion layer 306. Using the photoresist layer 314 as a mask, boron is ion implanted into the polysilicon layer 311 located over the N-well diffusion layer 306 so that the polysilicon layer will have N-type conductivity. This state is illustrated in FIG. 1G.

Using a photoresist mask layer (not shown) formed by the seventh photoetching process, the polysilicon layer 311 is subjected to anisotropic etching to form an N+ polysilicon electrode 313 and a P+ polysilicon gate electrode 315. This state is shown in FIG. 1H.

Next, the eighth photoetching process is carried out to form a photoresist mask layer 316 which has an opening over the P-well diffusion layer 304. Arsenic is ion implanted into the P-well diffusion layer 304 to form N+ diffusion layers in the P-well diffusion layer using the photoresist layer 316 and the field oxide layer 307 as a mask. This state is illustrated in FIG. 1I.

Next, after the photoresist layer 316 is removed, the ninth photoetching process is carried out to form a photoresist mask layer 318 which has an opening over the N-well diffusion layer 306. The N-well diffusion layer 306 is ion implanted with boron fluoride to form P+ diffusion layers in the N-well diffusion layer using the photoresist layer 318 and the field oxide layer 307 as a mask. This state is illustrated in FIG. 1J.

The semiconductor substrate 301 is next subjected to heat treatment to form N+ diffusion layers 317 and P+ diffusion layers 319. An interlayer insulating layer 320 is formed and then etched to form contact holes for the N+ diffusion layers and the P+ diffusion layers. Metal layers 321 and a passivation film 322 are then formed to thereby complete the semiconductor device. This state is illustrated in FIG. 1K.

With the advance of semiconductor technologies, the scale of semiconductor devices has increased and the demand for higher packing densities per chip is increasing. In particular, since the recent submicron generation, the number of manufacturing steps and the manufacturing time have increased, which will be due partly to the use of multilayer interconnection. For example, with the above-described conventional manufacturing method for a MOS semiconductor device, the total number of etching steps required is nine. This will result in a considerable increase in manufacturing cost and manufacturing time.

SUMMARY OF THE INVENTION

It is therefore an object of the invention to reduce the manufacturing cost and the manufacturing time by checking an increase in the number of steps in the manufacture of a semiconductor device, particularly by decreasing the number of photoetching steps in the manufacture of a semiconductor device.

According to a first aspect of the invention there is provided a method of manufacturing a semiconductor device comprising the steps of: forming an oxide layer over the major surface of a semiconductor substrate; depositing a conductive layer over the entire surface; forming a mask layer which has an opening to expose a portion of said conductive layer; ion implanting first impurities into said semiconductor substrate through said conductive layer and said oxide layer using said mask layer as a mask; ion implanting second impurities into said conductive layer using said mask layer as a mask; and etching, after said mask layer is removed, said conductive layer so as to leave its portion, thereby forming a gate electrode.

According to a second aspect of the invention there is provided a method of manufacturing a semiconductor device comprising the steps of: forming an oxide layer over the major surface of a semiconductor substrate; depositing a conductive layer over the entire surface of said oxide layer; etching said conductive layer so as to leave its portion which serves as a gate electrode; forming a mask layer which has an opening over said gate electrode and said oxide layer; ion implanting first impurities into said semiconductor substrate through said gate electrode and said oxide layer using said mask layer as a mask; and ion implanting second impurities into said gate electrode and said semiconductor substrate using said mask layer as a mask.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 3A through 3J are sectional views of a semiconductor device in the order of manufacturing steps in a manufacturing method according to a second embodiment of the invention.

DETAILED DESCRIPTION OF THE PREFERRED EMBODIMENTS

First, a first embodiment of the invention will be described taking a method of manufacturing a CMOS semiconductor device by way of example.

Figure 1A:
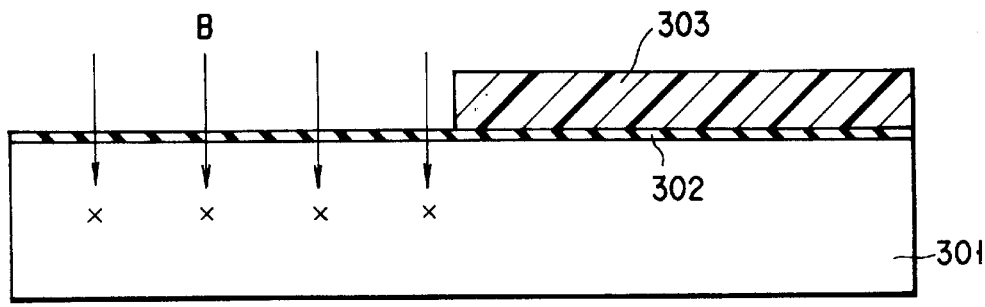
FIGS. 1A through 1K are sectional views of a semiconductor device in the order of manufacturing steps in a conventional manufacturing method.
Figure 1B:
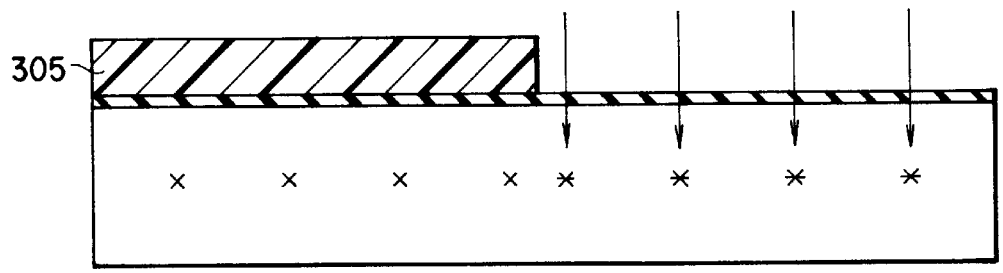
Figure 1C:
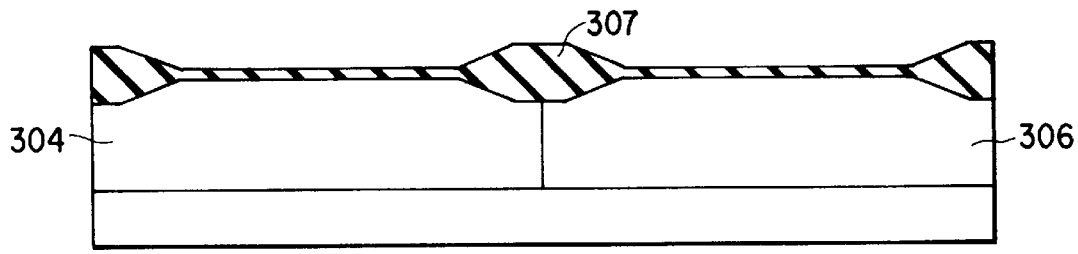
Figure 1D:
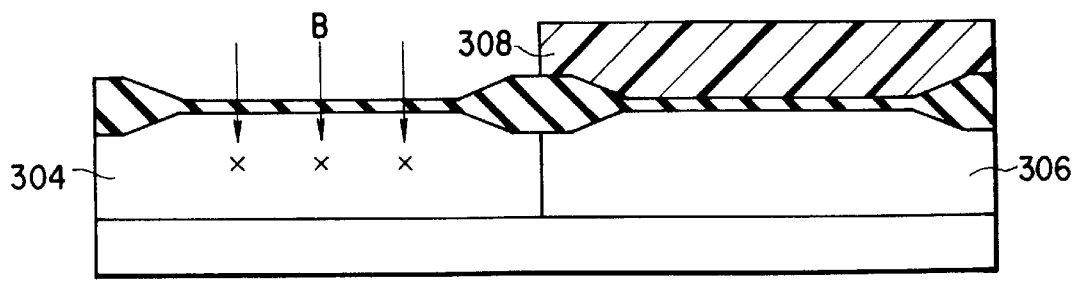
Figure 1E:
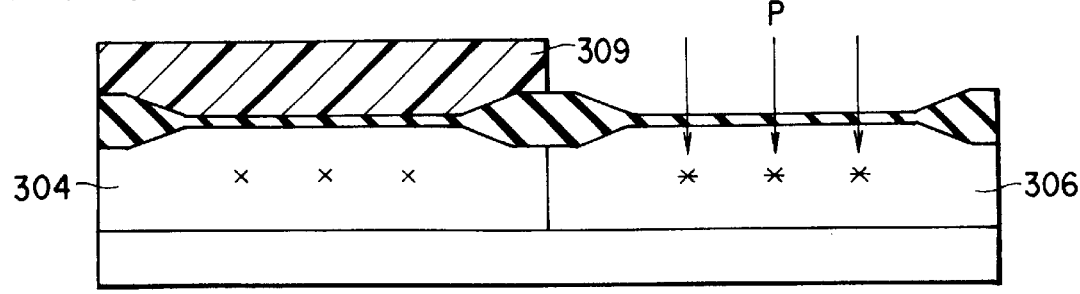
Figure 1F:
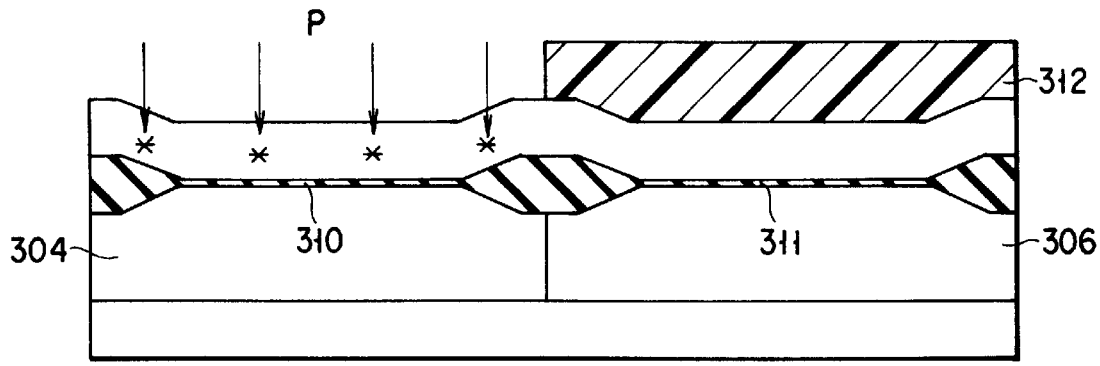
Figure 1G:
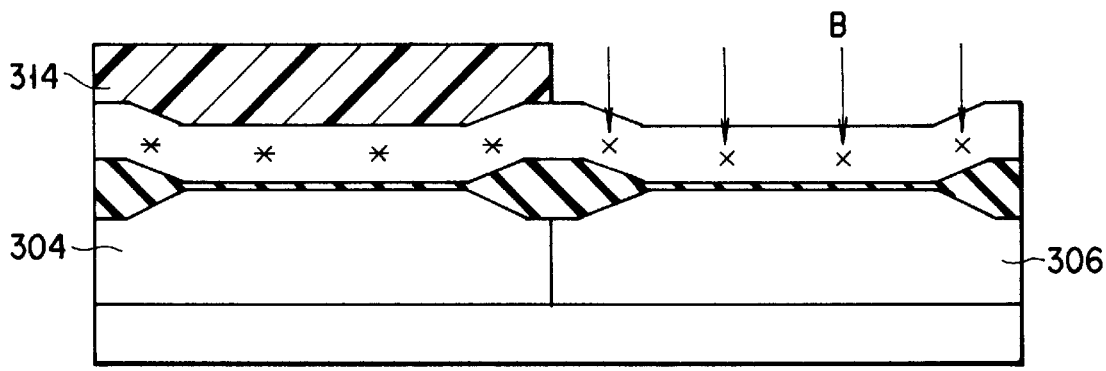
Figure 1H:
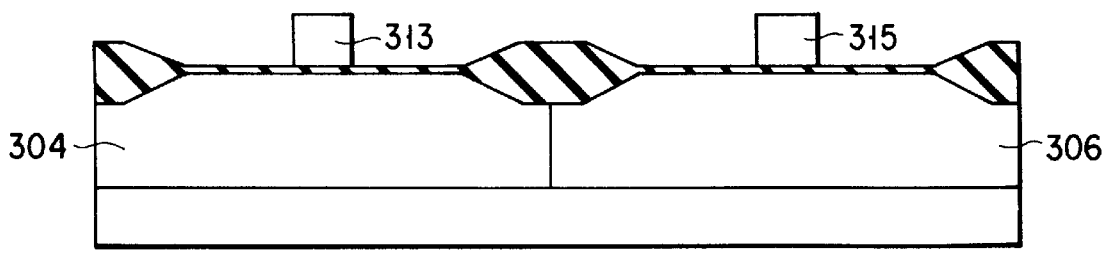
Figure 1I:
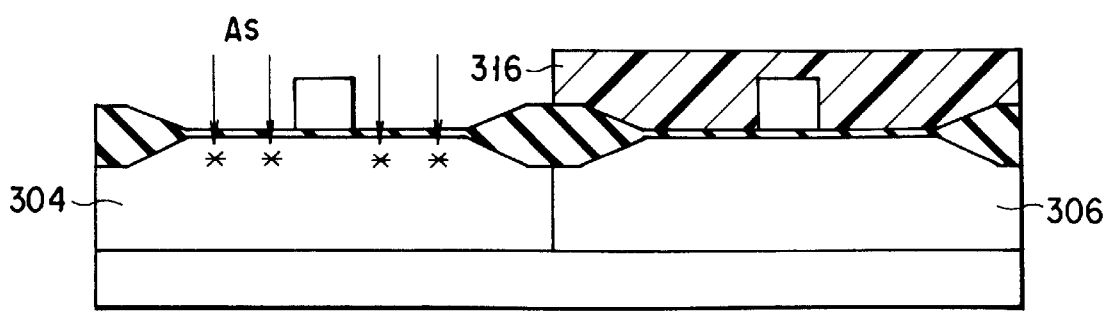
Figure 1J:
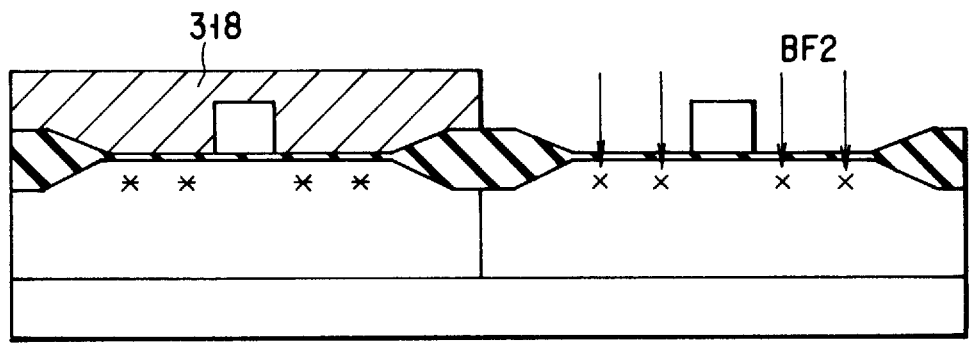
Figure 1K:
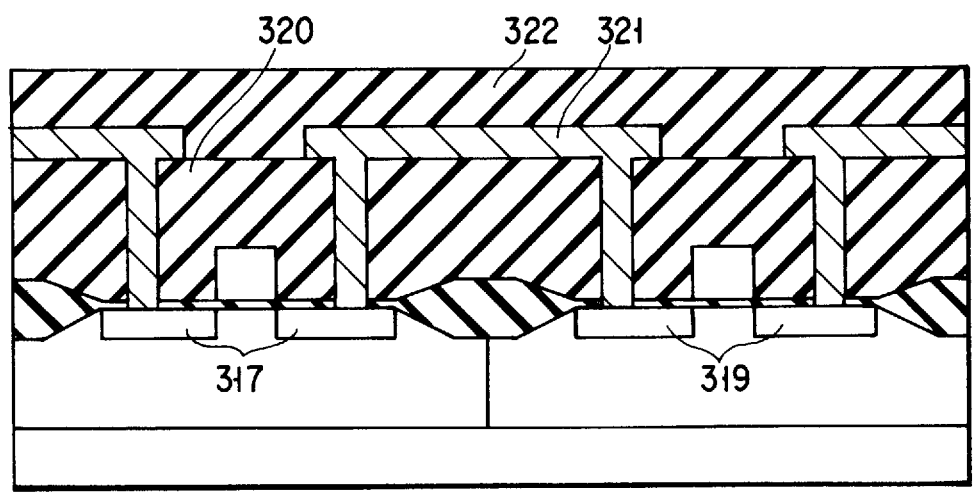
Figure 2A:
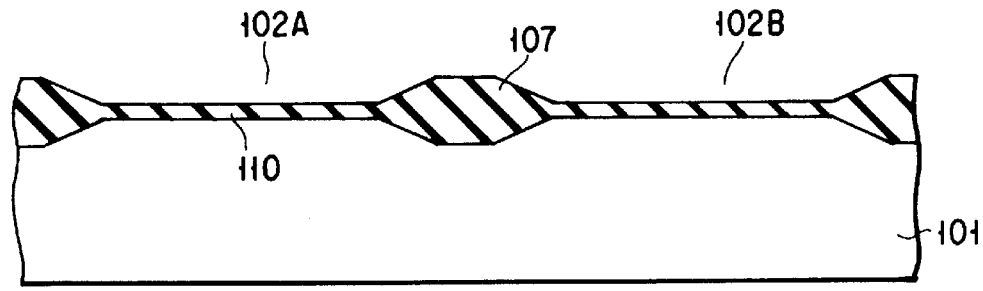
FIGS. 2A through 2L are sectional views of a semiconductor device in the order of manufacturing steps in a manufacturing method according to a first embodiment of the invention.

First, a field oxide layer 107, serving as a device isolation region, is formed on the surface of a semiconductor substrate 101 by means of selective oxidation by way of example. By this field oxide layer, a first device region 102A and a second device region 102B are defined in the semiconductor substrate 101. A gate oxide layer 110 is formed to a thickness of about 10 nm over the surface of the semiconductor substrate 101 by means of thermal oxidation. This state is illustrated in FIG. 2A.

Figure 2B:
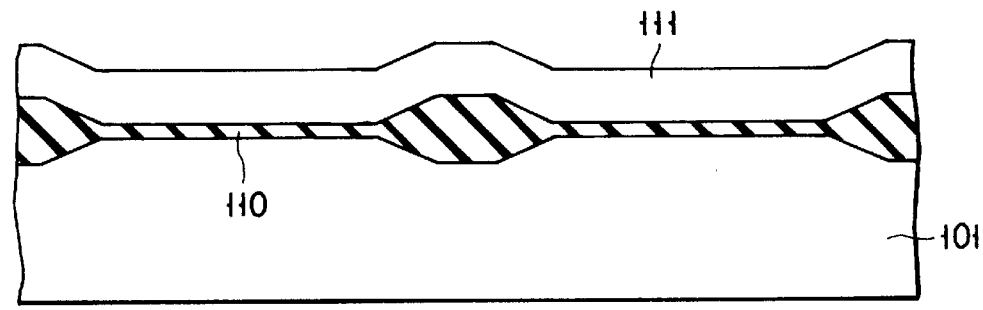

Next, a polysilicon layer 111 is formed to a thickness of about 200 nm over the field oxide layer 107 and the gate oxide layer 110 by chemical vapor deposition (CVD). This state is shown in FIG. 2B.

Figure 2C:
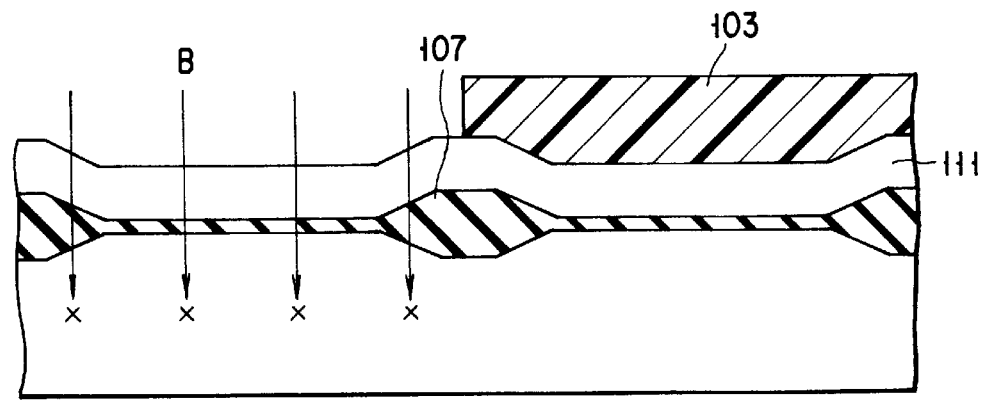

Next, the first photoetching step is carried out to form over the polysilicon layer 111, a photoresist mask layer 103 which has an opening over a semiconductor region where a P-well diffusion layer is to be formed (i.e., the first device region 102A). To form the P-well diffusion region, impurities of, for example, boron are ion implanted into the semiconductor substrate 101 through the polysilicon layer 111 at 450 KeV and at a dose of $2\times10^{13} cm^{-2}$ by the use of the photoresist layer 103 and the field oxide layer 107 as a mask. This state is illustrated in FIG. 2C.

Figure 2D:
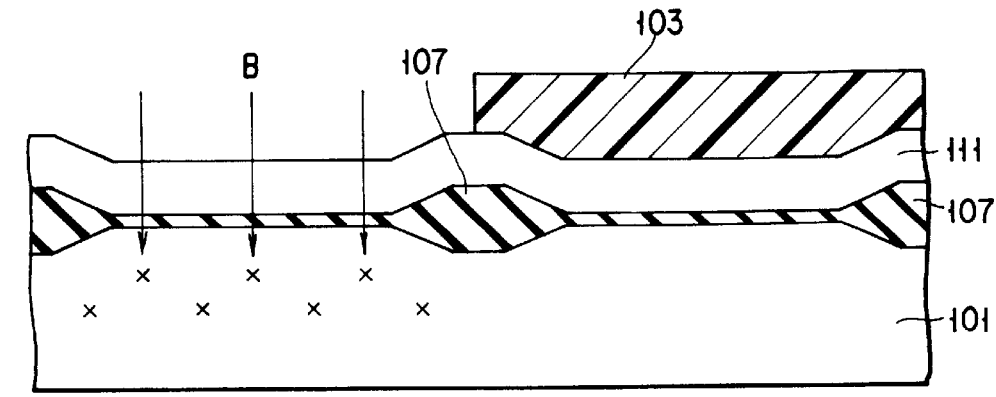

Next, to adjust the threshold voltage of the N-channel device in the semiconductor substrate, impurities of, for example, boron are implanted into the semiconductor substrate 101 through the polysilicon layer 111 at 100 KeV and at a dose of $4\times10^{12} cm^{-2}$ using the photoresist layer 103 and the field oxide layer 107 as a mask. This state is illustrated in FIG. 2D.

Figure 2E:
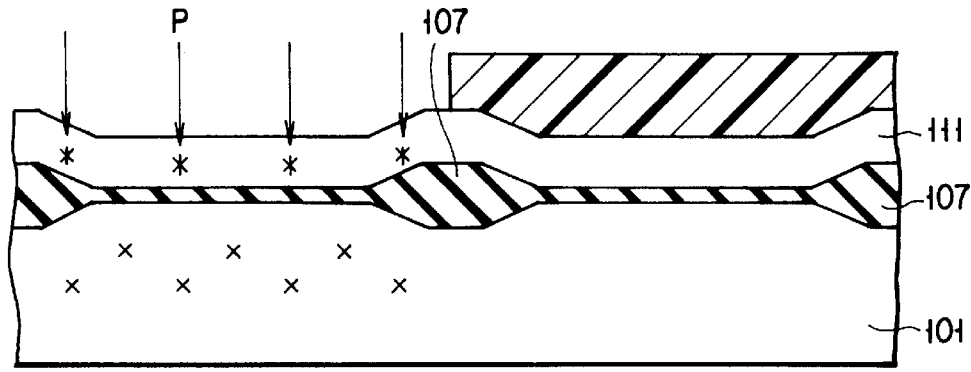

Next, in order to allow the polysilicon layer 111 to have N type conductivity, impurities of, for example, phosphorus are ion implanted into the polysilicon layer 111 at 30 KeV and at a dose of $5\times10^{15} cm^{-2}$ using the photoresist layer 103 as a mask. This state is illustrated in FIG. 2E.

Figure 2F:
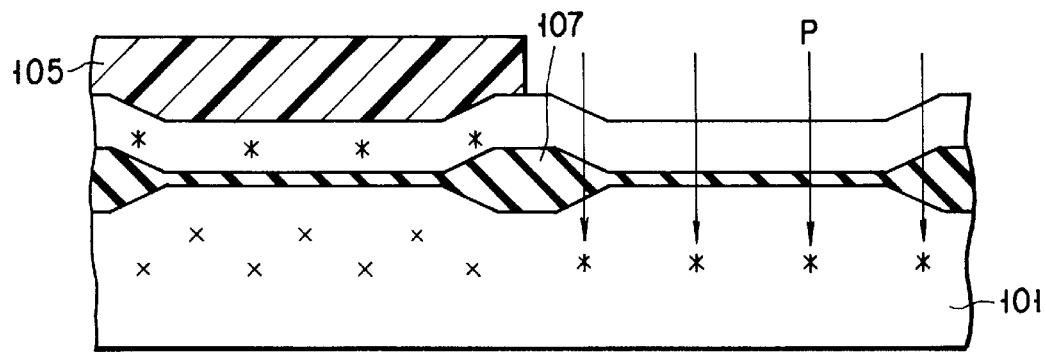

Next, after the photoresist layer 103 is removed, the second photoetching step is carried out to form, over the polysilicon layer 111, a photoresist mask layer 105 which has an opening over a semiconductor region where an N-well diffusion layer is to be formed (i.e., the second device region 102B). To form the N-well diffusion region, impurities of, for example, phosphorus are ion implanted into the semiconductor substrate 101 through the polysilicon layer 111 at 1.1 MeV and at a dose of $2\times10^{13} cm^{-2}$ by using the photoresist layer 105 and the field oxide layer 107 as a mask. This state is illustrated in FIG. 2F.

Figure 2G:
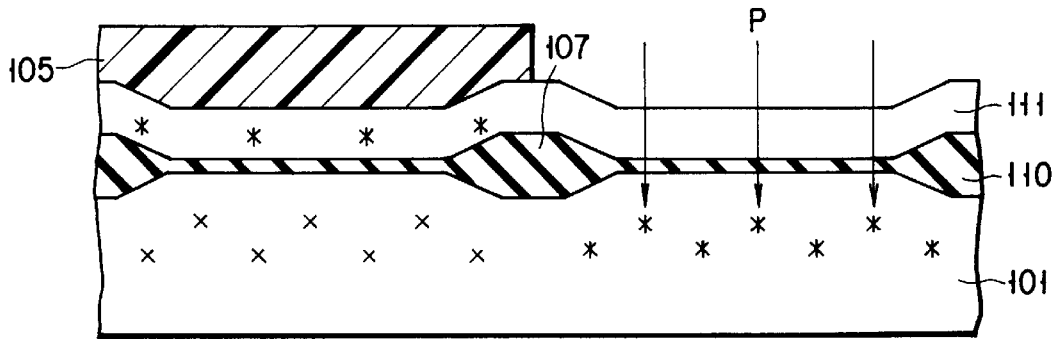

Next, to adjust the threshold voltage of the P-channel device in the semiconductor substrate, impurities of, for example, phosphorus are implanted into the semiconductor substrate 101 through the polysilicon layer 111 at 240 KeV and at a dose of $4\times10^{12} cm^{-2}$ using the photoresist layer 105 and the field oxide layer 107 as a mask. This state is illustrated in FIG. 2G.

Figure 2H:
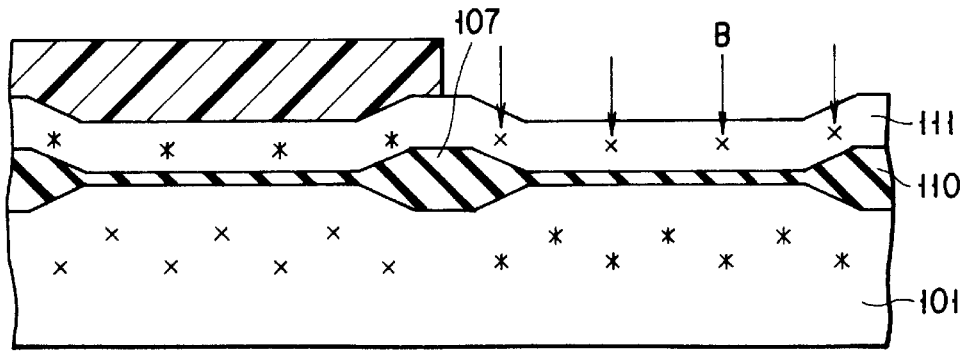

Next, in order to furnish the polysilicon layer 111 with P type conductivity, impurities of, for example, boron are ion implanted into the polysilicon layer 111 at 15 KeV and at a dose of $5\times10^{15} cm^{-2}$ using the photoresist layer 105 as a mask. This state is illustrated in FIG. 2H.

Figure 2I:
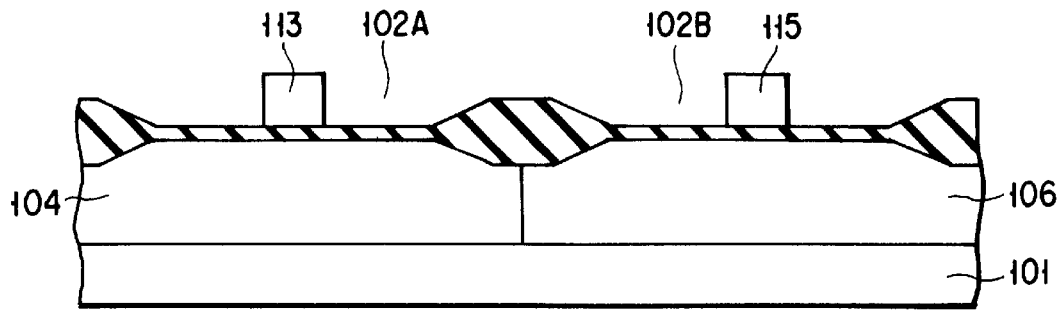

Next, the photoresist layer 105 is removed and the third photoetching operation is carried out to form a photoresist layer (not shown). By using this photoresist layer as a mask, the polysilicon layer 111 is subjected to anisotropic etching to leave portions of the polysilicon layer 111. Thereby, an N+ polysilicon gate electrode 113 is formed over the first device region 102A, and a P+ polysilicon gate electrode 115 is formed over the second device region 102B. This state is illustrated in FIG. 2I.

Figure 2J:
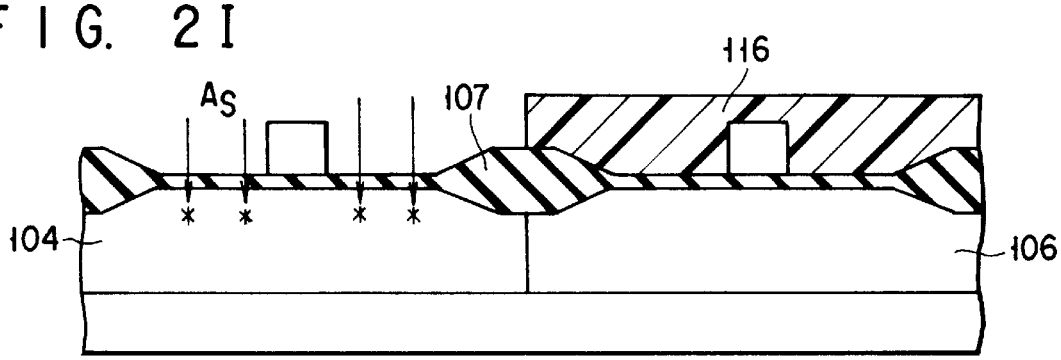

Next, the fourth photoetching step is carried out to form a photoresist mask layer 116 which has an opening over the P-well diffusion layer 104. To form N+ diffusion regions in the P-well diffusion region 104, impurities of, for example, arsenic (As) are ion implanted into the semiconductor substrate 101 at 35 KeV and at a dose of $3\times10^{15} cm^{-2}$ by using the photoresist layer 116, the field oxide layer 107 and the polysilicon gate electrode 113 as a mask. This state is illustrated in FIG. 2J.

Figure 2K:
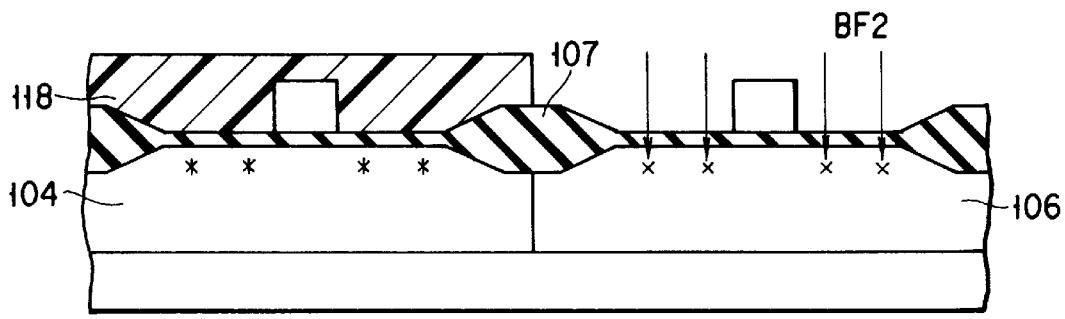

Next, the photoresist layer 116 is removed and the fifth photoetching step is carried out to form a photoresist mask layer 118 which has an opening over the N-well diffusion layer 106. To form P+ diffusion layers in the N-well diffusion region 104, impurities of, for example, boron fluoride ($BF_2$) are ion implanted into the semiconductor substrate 101 at 35 KeV and at a dose of $3\times10^{15} cm^{-2}$ by using the photoresist layer 118, the field oxide layer 107 and the polysilicon electrode 115 as a mask. This state is illustrated in FIG. 2K.

Figure 2L:
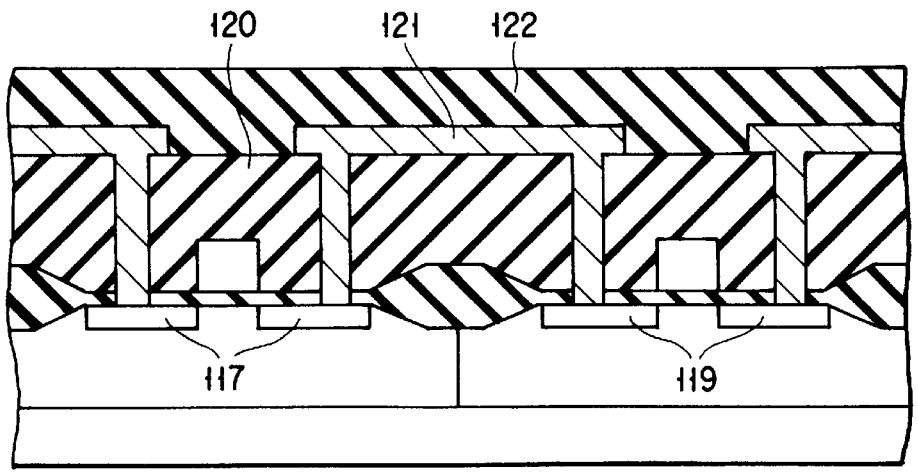

Next, the semiconductor substrate 101 is heated so that the previously implanted impurities are subjected to thermal diffusion. In this manner, the N+ diffusion layers 117 (the source and drain regions of an N-channel MOS transistor) and the P+ diffusion layers 119 (the source and drain regions of a P-channel MOS transistor) are formed. Further, an interlayer insulating layer 120 is formed and contact holes for the N+ diffusion layers 117 and the P+ diffusion layers 119 are formed in the interlayer insulating layer 120. Metal layers 121 and a passivation film 122 are formed to thereby complete the semiconductor device. This state is illustrated in FIG. 2L.

According to the first embodiment of the manufacturing method of the invention, a plurality of ion implantation steps are carried out by using one mask pattern, which will reduce the number of photoetching steps required to complete a semiconductor device from nine in the conventional method described above to five. As a result, in the manufacturing method of the invention, the number of photomasks used becomes four less than in the conventional method, which achieves a significant reduction in manufacturing cost. In addition, a decrease in the number of photoetching steps will result in a reduction in manufacturing time.

In the above steps of FIGS. 2C, 2D, 2F, and 2G, impurities are ion implanted into the semiconductor substrate 101 through the polysilicon layer 111. Thus, the polysilicon layer will suffer damage at each of the steps. However, the subsequent step in which the semiconductor substrate 101 is heated causes the polysilicon layer to recover from the damage. Therefore, no problem arises from the ion implantation through the polysilicon layer 111. Rather than some problem, the following advantage can be expected. That is, since other metals than the impurity ions to be implanted are introduced into the polysilicon layer 111 without being implanted into the semiconductor substrate 101 and the gate oxide layer 110, the characteristics of resulting semiconductor devices will not deteriorate.

In the first embodiment described above, the gate electrodes 113 and 115 are made of polysilicon. Instead of using polysilicon, amorphous silicon may be used for the gate electrodes.

Hereinafter, a second embodiment of the invention will be described taking a method of manufacturing a CMOS semiconductor device by way of example.

First, a field oxide layer 207 serving as a device isolation region is formed on a semiconductor substrate 201 by means of selective oxidation techniques by way of example. This field oxide layer serves to define a first device region 202A and a second device region 202B in the semiconductor substrate 201. Next, a gate oxide layer 210 is formed on the surface of the semiconductor substrate by means of thermal oxidation to a thickness of about 10 nm. This state is illustrated in FIG. 3A.

Next, a polysilicon layer 211 is formed over the field oxide layer 207 and the gate oxide layer 210 by means of chemical vapor deposition to a thickness of about 200 nm. This state is illustrated in FIG. 3B.

Next, the polysilicon layer 211 is subjected to anisotropic etching by using a photoresist layer (not shown) formed and then etched by the first photoetching step as a mask, thereby leaving a polysilicon layer 213 over the first device region 202A which will subsequently serve as an N+ polysilicon gate electrode and a polysilicon layer 215 over the first device region 202B which will subsequently serve as a P+ polysilicon gate electrode. This state is illustrated in FIG. 3C.

Next, a photoresist layer 203 is formed and then etched by the third photoetching step to form an opening over a region where a P-well diffusion layer is to be created (the first device region 202A). To form the P-well diffusion layer, impurities of, for example, boron are ion implanted into the semiconductor substrate 201 at 460 KeV and at a dose of $2 \times 10^{13} cm^{-2}$ by using the photoresist layer 203 and the field oxide layer 207 as a mask. This state is illustrated in FIG. 3D.

Figure 3E:
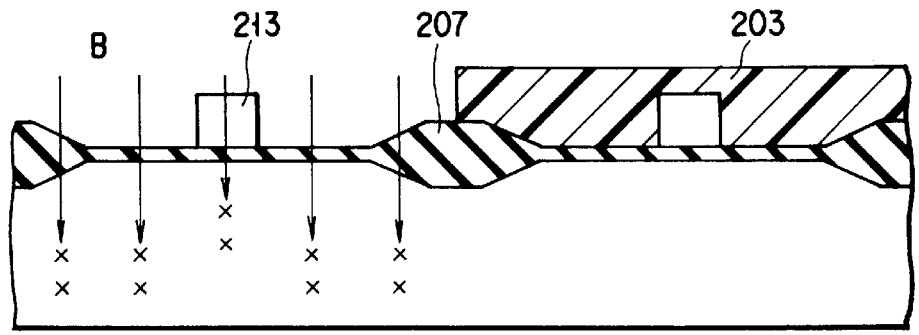

Next, to adjust the threshold voltage of the N-channel semiconductor device, impurities of, for example, boron are ion implanted into the semiconductor substrate 201 at 100 KeV and at a dose of $4 \times 10^{13} cm^{-2}$ using the photoresist layer 203 and the field oxide layer 207 as a mask. This state is illustrated in FIG. 3E.

Figure 3F:
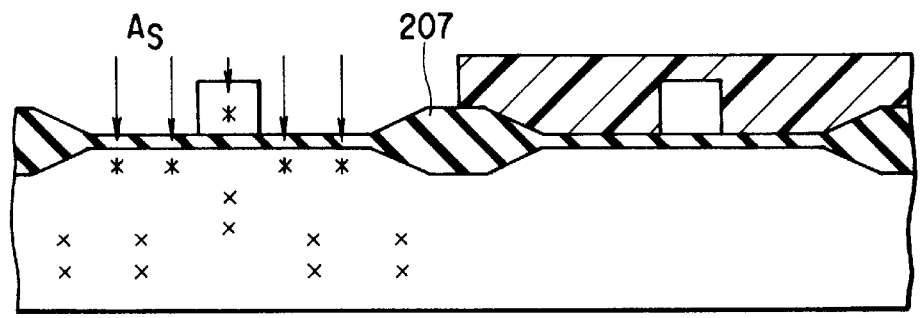

Next, in order to cause the polysilicon layer 213 to have N type conductivity and form N+ diffusion layers in the semiconductor substrate 201, impurities of, for example, arsenic are ion implanted at 35 KeV and at a dose of $3 \times 10^{15} cm^{-2}$ using the photoresist layer 203 and the field oxide layer 207 as a mask. This state is illustrated in FIG. 3F.

Figure 3G:
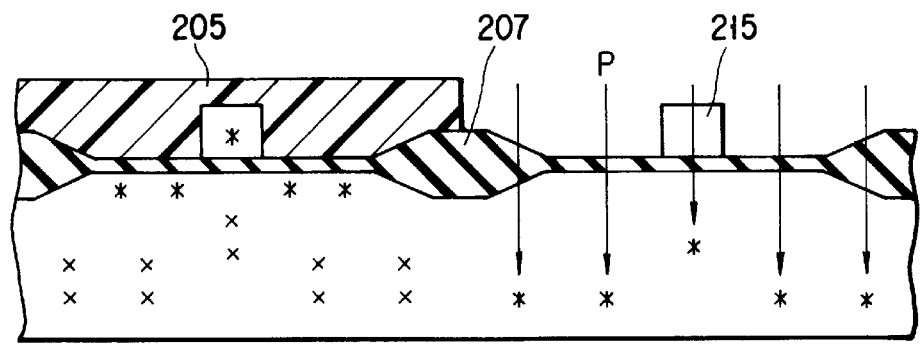

Next, after the photoresist layer 203 is removed, a photoresist layer 205 is formed and then etched by the third photoetching step to form an opening over a region where an N-well diffusion layer is to be created (the second device region 202B). To form the N-well diffusion layer, impurities of, for example, phosphorus are ion implanted into the semiconductor substrate 201 at 1.1 MeV and at a dose of $2 \times 10^{13} cm^{-2}$ by using the photoresist layer 205 and the field oxide layer 207 as a mask. This state is illustrated in FIG. 3G.

Figure 3H:
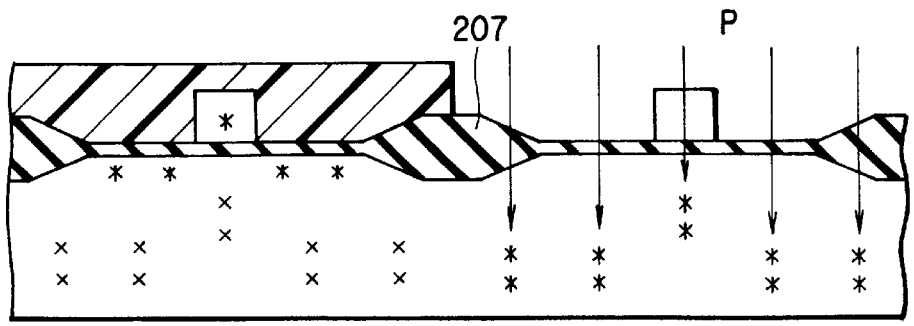

Next, to adjust the threshold voltage of the P-channel MOS semiconductor device, impurities of, for example, phosphorus are ion implanted into the N-well diffusion layer formed region in the semiconductor substrate 201 at 240 KeV and at a dose of $4 \times 10^{12} cm^{-2}$ using the photoresist layer 205 and the field oxide layer 207 as a mask. This state is illustrated in FIG. 3H.

Next, in order to cause the polysilicon layer 215 to have P type conductivity and form P+ diffusion layers in the semiconductor substrate 201, impurities of, for example, boron fluoride are ion implanted at 35 KeV and at a dose of $3 \times 10^{15} cm^{-2}$ using the photoresist layer 205 and the field oxide layer 207 as a mask. This state is illustrated in FIG. 3I.

Next, after the photoresist layer 205 is removed, the semiconductor substrate 201 is heated to subject the previously implanted impurities to thermal diffusion. Thus, a P-well diffusion layer 204, a N-well diffusion layer 206, N+ diffusion layers (the source and drain regions of an N-channel MOS transistor) 217 and P+ diffusion layers (the source and drain regions of a P-channel MOS transistor) 219 as well as the N+ polysilicon gate electrode 213 and the P+ polysilicon gate electrode 215 are formed. Further, an interlayer insulating layer 220 is formed and then contact holes for the N+ diffusion layers 217 and the P+ diffusion layers 219 are formed in that layer. Subsequently, metal layers 221 and a passivation layer 222 are formed to thereby complete a semiconductor device. This state is illustrated in FIG. 3J.

According to the second embodiment of the invention, the ion implantation to allow a polysilicon layer to have a conductivity type and the ion implantation to form the source and drain diffusion layers (the N+ diffusion layers 217 or the P+ diffusion layers 219) are performed simultaneously, which helps further decrease the number of photoetching steps in comparison with the previously described first embodiment.

In the second embodiment as well, the gate electrodes 213 and 215 are made of polysilicon. Instead of using polysilicon, amorphous silicon may be used for the gate electrodes.

The first and second embodiments of the invention are described in connection with manufacture of a CMOS semiconductor device. It should be noted, however, that the invention can be carried out to manufacture MOS semiconductor devices in general.

As described above, since, in the present invention, one mask pattern is used in common to a plurality of ion implantation steps, the number of photoetching steps in manufacture of a semiconductor device can be decreased in comparison with the conventional manufacturing method. Consequently, the number of manufacturing steps can be decreased and the manufacturing time can be reduced.

What is claimed is:

1. A method of manufacturing a semiconductor device comprising the steps of:
    forming an oxide layer over the major surface of a semiconductor substrate;
    depositing a conductive layer over the entire surface;
    forming a mask layer which has an opening to expose a portion of said conductive layer;
    ion implanting first impurities into said semiconductor substrate through said conductive layer and said oxide layer using said mask layer as a mask;
    ion implanting second impurities into said conductive layer using said mask layer as a mask; and
    etching, after said mask layer is removed, said conductive layer so as to leave a portion, thereby forming a gate electrode.

2. The method according to claim 1, wherein said first and second impurities are opposite to each other in conductivity type.

3. The method according to claim 1, further comprising, after the step of ion implanting said first impurities, ion implanting third impurities into said semiconductor substrate through said conductive layer and said oxide layer by using said mask layer as a mask.

4. The method according to claim 3, wherein said first impurities and said third impurities are of the same conductivity type, and an ion accelerating voltage in the step of ion implanting said first impurities is set higher than an ion accelerating voltage in the step of ion implanting said third impurities.

5. The method according to claim 1, further comprising the step of, after the formation of said gate electrode, ion implanting fourth impurities which are opposite in conductivity type to said first impurities into said semiconductor substrate using said gate electrode as a mask.

6. The method according to claim 5, further comprising the step of heating said semiconductor substrate after the step of ion implanting said fourth impurities.

7. The method according to claim 1, wherein said conductive layer is made of polysilicon.

8. The method according to claim 1, wherein said conductive layer is made of amorphous silicon.

9. The method according to claim 1, wherein said mask layer is made of a photoresist.

10. A method of manufacturing a semiconductor device comprising the steps of:
    forming an oxide layer over the major surface of a semiconductor substrate;
    depositing a conductive layer over the entire surface of said oxide layer;
    etching said conductive layer so as to leave a portion which serves as a gate electrode;
    forming a mask layer which has an opening over said gate electrode and said oxide layer;
    ion implanting first impurities into said semiconductor substrate through said gate electrode and said oxide layer using said mask layer as a mask; and
    ion implanting second impurities into said gate electrode and said semiconductor substrate using said mask layer as a mask.

11. The method according to claim 10, wherein said first and second impurities are opposite to each other in conductivity type.

12. The method according to claim 10, further comprising the step of, after the step of ion implanting said first impurities, ion implanting third impurities into said semiconductor substrate through said gate electrode and said oxide layer by using said mask layer as a mask.

13. The method according to claim 10, wherein said first impurities and said third impurities are of the same conductivity type, and an ion accelerating voltage in the step of ion implanting said first impurities is set higher than an ion accelerating voltage in the step of ion implanting said third impurities.

14. The method according to claim 10, further comprising, after the step of ion implanting said second impurities, ion implanting fourth impurities which are opposite in conductivity type to said first impurities into said semiconductor substrate using said mask layer and said gate electrode as a mask.

15. The method according to claim 14, further comprising the step of heating said semiconductor substrate after the step of ion implanting said fourth impurities.

16. The method according to claim 10, wherein said conductive layer is made of polysilicon.

17. The method according to claim 10, wherein said conductive layer is made of amorphous silicon.

18. The method according to claim 10, wherein said mask layer is made of a photoresist.

19. A method of manufacturing a semiconductor device comprising the steps of:
    forming an oxide layer over the major surface of a semiconductor substrate having a first and a second device region;
    depositing a conductive layer over the entire surface of said oxide layer;
    forming, over said conductive layer, a first mask layer having an opening located over said first device region in said semiconductor substrate;
    ion implanting first impurities into said semiconductor substrate through said conductive layer and said oxide layer using said first mask layer as a mask;
    ion implanting second impurities into said conductive layer using said first mask layer as a mask;
    forming, over said conductive layer, a second mask layer having an opening located over said second device region after said first mask layer is removed;
    ion implanting third impurities into said semiconductor substrate through said conductive layer and said oxide layer using said second mask layer as a mask;
    ion implanting fourth impurities into said conductive layer using said second mask layer as a mask; and
    etching, after said second mask layer is removed, said conductive layer so that first and second portions that are respectively located over said first and second device regions are left, thereby forming first and second gate electrodes over said first and second device regions, respectively.

20. The method according to claim 19, wherein said first impurities and said second impurities are of the same conductivity type and said third impurities and said fourth impurities are of opposite conductivity type.

21. The method according to claim 19, further comprising the steps of:

ion implanting, after the step of ion implanting said first impurities, fifth impurities into said semiconductor substrate through said conductive layer and said oxide layer using said first mask layer as a mask; and ion implanting, after the step of ion implanting said third impurities, sixth impurities into said semiconductor substrate through said conductive layer and said oxide layer using said second mask layer as a mask.

22. The method according to claim 21, wherein said first impurities and said fifth impurities are of the same conductivity type and an ion accelerating voltage in the step of ion implanting said first impurities is set higher than that in the step of ion implanting said fifth impurities, and wherein said third impurities and said sixth impurities are of the same conductivity type and an ion accelerating voltage in the step of ion implanting said third impurities is set higher than that in the step of ion implanting said sixth impurities.

23. The method according to claim 19, further comprising the steps of:

masking, after the step of forming said first and second gate electrodes, said second device region in said semiconductor substrate with a third mask layer;

ion implanting seventh impurities into said first device region in said semiconductor substrate using said first gate electrode as a mask;

masking, after the removal of said third mask layer, said first device region in said semiconductor substrate with a fourth mask layer; and ion implanting eighth impurities into said second device region in said semiconductor substrate using said second gate electrode as a mask.

24. The method according to claim 23, further comprising the step of heating said semiconductor substrate after the step of ion implanting said eighth impurities.

25. The method according to claim 19, wherein said conductive layer is made of polysilicon.

26. The method according to claim 19, wherein said conductive layer is made of amorphous silicon.

27. The method according to claim 23, wherein each of said first, second, third and fourth mask layers is made of a photoresist.

28. A method of manufacturing a semiconductor device comprising the steps of:

forming an oxide layer over the major surface of a semiconductor substrate having a first and a second device region;

depositing a conductive layer over the entire surface of said oxide layer;

etching said conductive layer so that first and second portions that are respectively located over said first and second device regions are left, thereby forming first and second gate electrodes over said first and second device regions, respectively;

forming, over said conductive layer, a first mask layer having an opening located over said first device region in said semiconductor substrate;

ion implanting first impurities into said semiconductor substrate through said first gate electrode and said oxide layer using said first mask layer as a mask;

ion implanting second impurities into said first gate electrode and said semiconductor substrate using said first mask layer as a mask;

forming, over said conductive layer, a second mask having an opening located over said second device region after said first mask layer is removed;

ion implanting third impurities into said semiconductor substrate through said second gate electrode and said oxide layer using said second mask layer as a mask; and ion implanting fourth impurities into said second gate electrode and said semiconductor substrate using said second mask layer as a mask.

29. The method according to claim 28, wherein said first impurities and said second impurities are of opposite conductive type and said third impurities and said fourth impurities are of opposite conductivity type.

30. The method according to claim 28, further comprising the steps of:

ion implanting, after the step of ion implanting said first impurities, fifth impurities into said semiconductor substrate through said first gate electrode and said oxide layer using said first mask layer as a mask; and ion implanting, after the step of ion implanting said third impurities, sixth impurities into said semiconductor substrate through said first gate electrode and said oxide layer using said second mask layer as a mask.

31. The method according to claim 30, wherein said first impurities and said fifth impurities are of the same conductivity type and an ion accelerating voltage in the step of ion implanting said first impurities is set higher than that in the step of ion implanting said fifth impurities, and wherein said third impurities and said sixth impurities are of the same conductivity type and an ion accelerating voltage in the step of ion implanting said third impurities is set higher than that in the step of ion implanting said sixth impurities.

32. The method according to claim 30, further comprising the step of heating said semiconductor substrate after the step of ion implanting said sixth impurities.

33. The method according to claim 28, wherein said conductive layer is made of polysilicon.

34. The method according to claim 28, wherein said conductive layer is made of amorphous silicon.

35. The method according to claim 28, wherein each of said first and second mask layers is made of a photoresist.

* * * * *